(12) United States Patent
Tsukamoto et al.

(10) Patent No.: US 10,181,846 B2
(45) Date of Patent: Jan. 15, 2019

(54) OVERCURRENT PROTECTION CIRCUIT

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Katsuma Tsukamoto, Yokkaichi (JP); Yusuke Yano, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRLES, LTD., Osaka (JP)

( * ) Notice: Subject to any disclaimer, the term of this patent is extended or adjusted under 35 U.S.C. 154(b) by 316 days.

(21) Appl. No.: 15/030,199

(22) PCT Filed: Oct. 17, 2014

(86) PCT No.: PCT/JP2014/077661
§ 371 (c)(1),
(2) Date: Apr. 18, 2016

(87) PCT Pub. No.: WO2015/064386
PCT Pub. Date: May 7, 2015

(65) Prior Publication Data
US 2016/0241226 A1    Aug. 18, 2016

(30) Foreign Application Priority Data
Oct. 30, 2013    (JP) ................................ 2013-225832

(51) Int. Cl.
*H03K 17/082* (2006.01)
*H02H 11/00* (2006.01)
(Continued)

(52) U.S. Cl.
CPC ........... *H03K 17/0822* (2013.01); *H02H 3/20* (2013.01); *H02H 11/006* (2013.01); *H03K 17/18* (2013.01); *H03K 2217/0027* (2013.01)

(58) Field of Classification Search
CPC ............... H03K 17/0822; H03K 17/18; H03K 2217/0027; H02H 3/20; H02H 11/006
(Continued)

(56) References Cited

U.S. PATENT DOCUMENTS 5,554,919 A * 9/1996 Uchida ................. H01M 10/44
320/132
2002/0018329 A1    2/2002 Yoshida
(Continued)

FOREIGN PATENT DOCUMENTS

JP    H04-134271 A    5/1992
JP    2003-198349 A    7/2003
(Continued)

OTHER PUBLICATIONS

Dec. 22, 2014 International Search Report issued in International Patent Application No. PCT/JP2014/077661.
(Continued)

*Primary Examiner* — Kevin J Comber
(74) *Attorney, Agent, or Firm* — Oliff PLC

(57) ABSTRACT

An overcurrent protection circuit that can cope even with a case where a ground fault occurs in a mask time period for overcurrent detection. The overcurrent protection circuit detects, when a switching element is on, a differential voltage value between both ends of the switching element that is caused by an electric current flowing therethrough,
(Continued)

and turns off the switching element when the detected differential voltage value is larger than a predetermined voltage value. A detection circuit that detects respective voltage values at both ends of the switching element, and means for preventing the switching element from being turned on if either of the respective voltage values detected by the detection circuit is less than a predetermined value.

6 Claims, 7 Drawing Sheets

(51) Int. Cl.
    *H02H 3/20*     (2006.01)
    *H03K 17/18*     (2006.01)

(58) Field of Classification Search
    USPC .......................................................... 361/90
    See application file for complete search history.

(56) References Cited

U.S. PATENT DOCUMENTS

| | | |
|---|---|---|
| 2010/0259856 A1 | 10/2010 | Senriuchi et al. |
| 2011/0085275 A1 | 4/2011 | Ohshima |
| 2012/0068546 A1 | 3/2012 | Kuramochi et al. |

FOREIGN PATENT DOCUMENTS

| | | |
|---|---|---|
| JP | 2009-296367 A | 12/2009 |
| JP | 2012-070055 A | 4/2012 |

OTHER PUBLICATIONS

Sep. 16, 2016 Extended European Search Report issued in European Application No. 14858024.4.

\* cited by examiner

OVERCURRENT PROTECTION CIRCUIT

TECHNICAL FIELD

Preferred embodiments of the present disclosure relate to an overcurrent protection circuit that detects, when a switching element is on, a differential voltage value between both ends of the switching element that is caused by a current flowing therethrough, and turns off the switching element when the detected differential voltage value is larger than a predetermined voltage value.

BACKGROUND ART

FIG. 5 is a circuit diagram illustrating an example of a configuration of the main parts of a conventional overcurrent protection circuit for use in a vehicle.

This overcurrent protection circuit is a circuit that protects a switching element 7 connected between the plus electrode of a battery 11 and the supply terminal of the load 10. The ground terminal of the load 10 is grounded.

The switching element 7 has a configuration in which the source of an N-channel MOSFET (metal-oxide semiconductor field-effect transistor) 8 whose drain is connected to the plus electrode of the battery 11, and the source of an N-channel MOSFET 9 whose drain is connected to the load are adjacent and connected to each other. The FETs 8 and 9 are drive-controlled by a driver (driving circuit) 5 so as to be turned on or off at the same time.

Furthermore, one end of a resistor 4 is connected to the plus electrode of the battery 11, and the other end of the resistor 4 is connected to the input terminal of a constant current circuit 3 and the non-inverting input terminal of a comparator 2. The output terminal of the constant current circuit 3 is grounded, and the inverting input terminal of the comparator 2 is connected to the supply terminal of the load 10 via a resistor 6.

The output terminal of the comparator 2 is connected to one input terminal of an AND circuit 1, an inverted signal of a mask signal is input to the other input terminal of the AND circuit 1, and an output of the AND circuit 1 is given to the driver (driving circuit) 5. The mask signal, and a command signal for the driver are given from a not-shown ECU (Electronic Control Unit) of the load 10.

Hereinafter, examples of operations of an overcurrent protection circuit having such a configuration will be described with reference to the timing diagrams of FIGS. 6 and 7 showing that example.

Note that the output voltage value of the battery 11 is assumed to be constant (FIGS. 6A and 7A).

The constant current circuit 3 generates a threshold voltage of a drop voltage by letting a constant current flow through the resistor 4. When an overcurrent flows through the switching element 7, and the value of a drop voltage caused by the on-resistance of the switching element 7 increases to a value larger than the value of the drop voltage generated by the constant current of the resistor 4 (the voltage value itself decreases), the comparator 2 needs only to output a plus signal so as to stop the driver 5.

However, when the switching element 7 is off (FIGS. 6B and 7B), a differential voltage value between both ends of the switching element 7 (a switching element potential difference of FIGS. 6C and 7C) is at the level of the voltage value of the battery 11 and exceeds the threshold voltage. Therefore, a mask time period (FIGS. 6E and 7E) in which output of the comparator 2 is disabled needs to be provided for a time period in which the switching element 7 is off, and a time period in which the state of the switching element 7 is transient from off to on.

In this overcurrent protection circuit, the mask time period is configured such that an inverted signal of a mask signal is given to the other input terminal of the AND circuit 1, and thus, during the mask time period, the AND circuit 1 continues to output an L-level signal and does not stop the driver 5 even when the output signal of the comparator 2 becomes positive.

Accordingly, in this overcurrent protection circuit, when the output of the driver 5 is off (FIGS. 6B and 7B), a mask signal is applied to realize the mask time period (FIGS. 6E and 7E), and thus the output signal of the comparator 2 is disabled although the differential voltage value between both ends of the switching element 7 (switching element potential difference of FIGS. 6C and 7C) exceeds the threshold voltage (overcurrent detection threshold).

Also in the transient time period in which the output of the driver 5 changes from off to on (FIG. 6B), a mask signal is applied to realize the mask time period (FIG. 6E), and thus the output signal of the comparator 2 is disabled although the differential voltage value between both ends of the switching element 7 (switching element potential difference of FIG. 6C) exceeds the threshold voltage (overcurrent detection threshold).

A time period in which the output of the driver 5 steadily remains on (FIG. 6B) serves as a non-mask time period since no mask signal is applied (FIG. 6E).

In this state, if a ground fault occurs in the load 10 on the supply terminal side (FIG. 6D), the current flowing through the switching element 7 will increase (FIG. 6D) and the differential voltage value between both ends of the switching element 7 (FIG. 6C) will exceed the threshold voltage (overcurrent detection threshold). Accordingly, the comparator 2 outputs a plus signal, the AND circuit 1 outputs an H-level overcurrent detection signal, the output signal of the driver 5 changes from on to off (FIG. 6B), and the current flowing through the switching element 7 starts decreasing before reaching a breakdown current and eventually takes on zero (FIG. 6D).

Patent Document 1 discloses a load circuit overcurrent protection device that is capable of highly accurate overcurrent detection without being affected by an on-resistance deviation ±ΔRon of a semiconductor element.

CITATION LIST

Patent Document

Patent Document 1: JP 2009-296367A

Technical Problem

As discussed above, in conventional overcurrent protection circuits, during the time when (i) the switching element 7 is off, and (ii) when the switching element 7 is transient from off to on, a masking signal (FIG. 6E) is necessary to prevent a false detection of a ground fault. However, the use of the masking signal during the time when the switching element is either off or in a transient state creates a problem in that a ground fault that occurs during this time period would not be detected. For example, if a ground fault were to occur in the load 10 on the supply terminal side when the switching element is off or in the transient state, the current flowing through the switching element 7 could increase to exceed the breakdown current (FIG. 7D) and no ground fault would be detected due to the use of the masking signal.

Note that since the ground fault occurs in the load 10 on the supply terminal side, the differential voltage value between both ends of the switching element 7 (FIG. 7C) is maintained substantially at: (output voltage value of the battery 11)−(threshold voltage for overcurrent detection).

The above-described overcurrent protection circuit has one power supply system, but the same problem is caused even when the switching element is connected between, for example, a main battery and a sub (subordinate) battery.

Preferred embodiments were made in view of the above-described circumstances, and it is an object of preferred embodiments to provide an overcurrent protection circuit that can cope even with a case where a ground fault occurs in a mask time period for overcurrent detection.

Solution to Problem

According to a first aspect, an overcurrent protection circuit for detecting, when a switching element is on, a differential voltage value between both ends of the switching element that is caused by an electric current flowing through the switching element, and turning off the switching element when the detected differential voltage value is larger than a predetermined voltage value, includes: a detection circuit for detecting respective voltage values at the both ends; and means for preventing the switching element from being turned on if either of the respective voltage values detected by the detection circuit is less than the predetermined value.

In this overcurrent protection circuit, when the switching element is on, a differential voltage value between both ends of the switching element that is caused by a current flowing therethrough is detected, and the switching element is turned off when the detected differential voltage value is larger than a predetermined voltage value. The detection circuit detects respective voltage values at both ends of the switching element, and if either of the respective voltage values detected by the detection circuit is less than the predetermined value, the preventing means prevents the switching element from being turned on.

According to a second aspect, the overcurrent protection circuit may be such that the detection circuit is a NAND circuit or an AND circuit to which the respective voltage values at the both ends are input.

In the overcurrent protection circuit, since the detection circuit is a NAND circuit or an AND circuit to which the respective voltage values at the both ends of the switching element are input, it is possible to determine whether or not either of the voltage values is less than the predetermined value without detecting the respective voltage values at the both ends of the switching element using a detecting device.

According to a third aspect, the overcurrent protection circuit may be such that the switching element is connected between a main storage cell and an auxiliary storage device that is auxiliary to the main storage cell, and the voltage values at the both ends are respective output voltage values of the main storage cell and the auxiliary storage device.

In the overcurrent protection circuit, the switching element is connected between the main storage cell and the auxiliary storage device that is auxiliary to the main storage cell, and the voltage values between both ends of the switching element are respective output voltage values of the main storage cell and the auxiliary storage device.

Advantages

According to preferred embodiments, it is possible to realize an overcurrent protection circuit that can cope even with a case where a ground fault occurs in a mask time period for overcurrent detection. Furthermore, since the ground fault state can be detected before the switching element is turned on, there is no need for taking into consideration overcurrent detection during the time period in which the switching element 7 is transient from off to on, and thus the mask time period for overcurrent detection is easily set (can be set to be larger), making it possible to prevent a malfunction.

DESCRIPTION OF EMBODIMENT

Hereinafter, aspects of a preferred embodiments will be described with reference to the drawings illustrating embodiment thereof.

Embodiment

Figure 1:
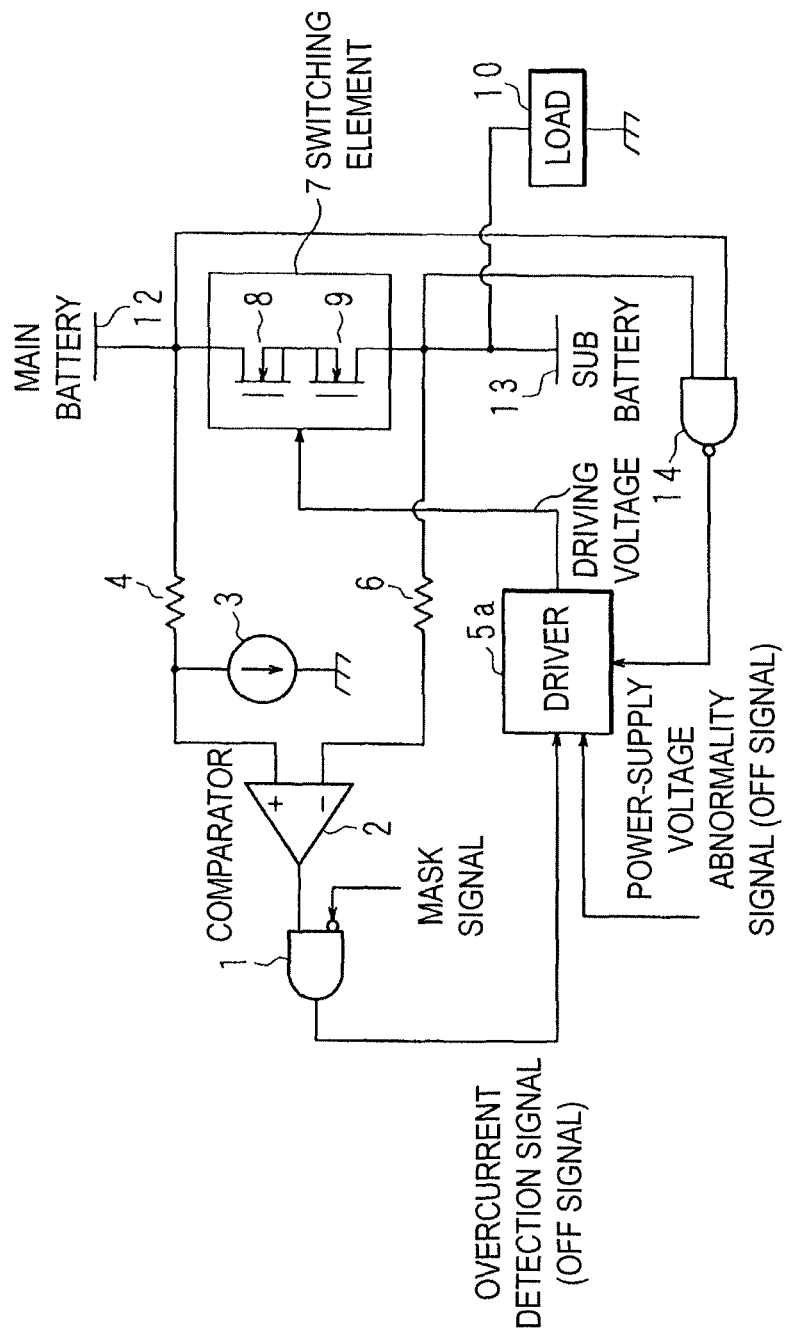
FIG. 1 is a circuit diagram illustrating a configuration of the main parts of an overcurrent protection circuit according to an embodiment.

FIG. 1 is a circuit diagram illustrating a configuration of the main parts of an overcurrent protection circuit according to an embodiment.

This overcurrent protection circuit is a circuit that protects a switching element 7 connected between the plus electrode of a main battery (main storage cell) 12 and the plus electrode of a sub battery (auxiliary storage device, auxiliary energy storage device) 13. The supply terminal of a load 10 is connected to the plus electrode of the sub battery 13, and the ground terminal of the load 10 is grounded.

The switching element 7 has a configuration in which the source of an N-channel MOSFET (metal-oxide semiconductor field-effect transistor) 8 whose drain is connected to the plus electrode of the main battery 12, and the source of an N-channel MOSFET 9 whose drain is connected to the plus electrode of the sub battery 13 are adjacent and connected to each other. The FETs 8 and 9 are drive-controlled by a driver (driving circuit) 5a so as to be turned on or off at the same time.

Furthermore, one end of a resistor 4 is connected to the plus electrode of the main battery 12, and the other end of the resistor 4 is connected to the input terminal of a constant current circuit 3 and the non-inverting input terminal of a comparator 2. The output terminal of the constant current circuit 3 is grounded, and the inverting input terminal of the comparator 2 is connected to the plus electrode of the sub battery 13 via a resistor 6.

The output terminal of the comparator 2 is connected to one input terminal of an AND circuit 1, an inverted signal of a mask signal is input to the other input terminal of the AND circuit 1, and an output of the AND circuit 1 is given to the driver (driving circuit) 5a. The mask signal, and a command signal for the driver are provided by a not-shown ECU (Electronic Control Unit) of the power supply system.

The plus electrode of the main battery 12 and the plus electrode of the sub battery 13 are respectively connected to the input terminals of a NAND circuit (preventing means) 14, and an output signal of the NAND circuit 14 is given to the driver 5a. Note that the NAND circuit 14 can be replaced by an AND circuit depending on a configuration of the driver 5a.

Figure 2:
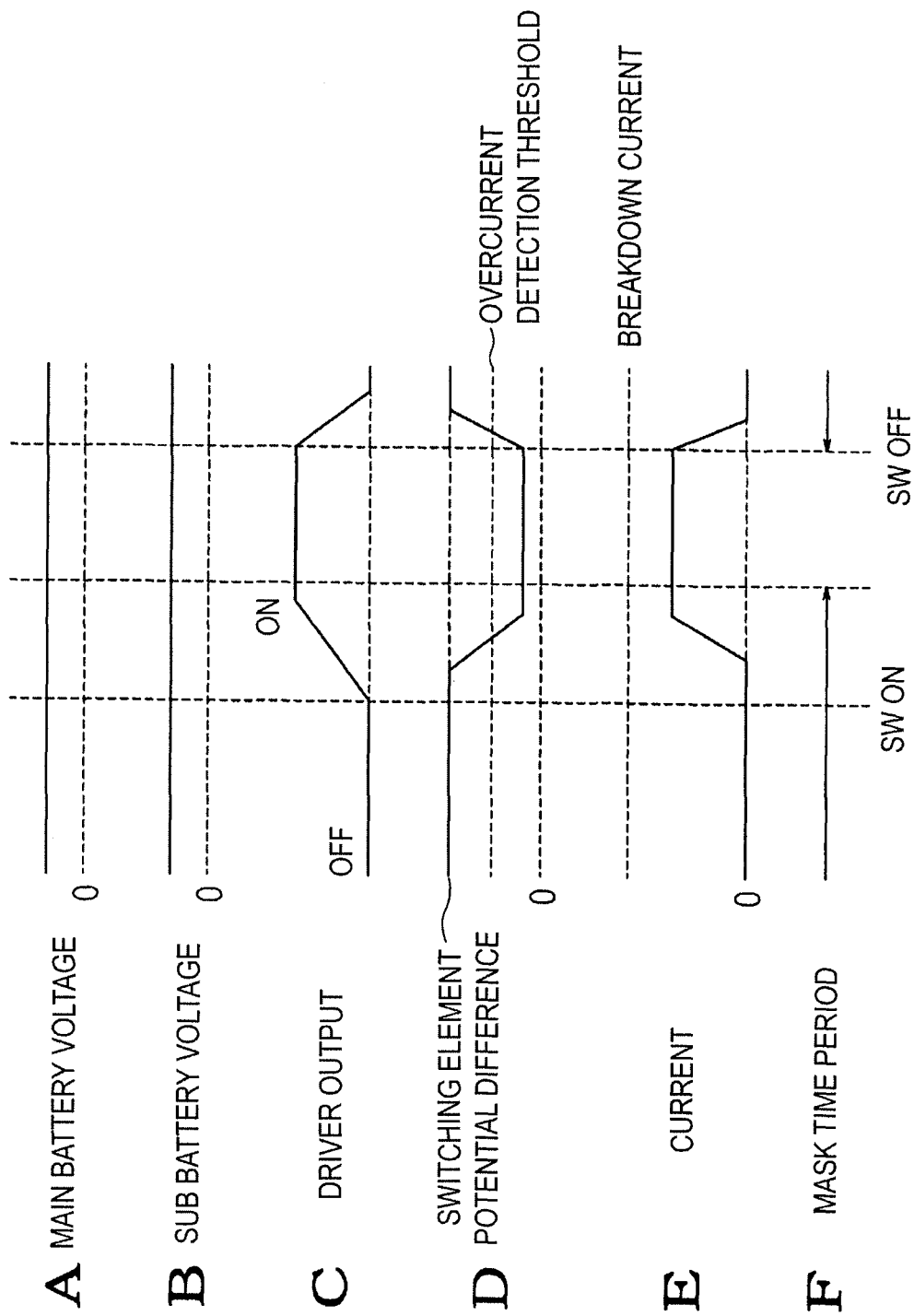
FIG. 2 is a timing diagram illustrating an example of an operation of the overcurrent protection circuit shown in FIG. 1.
Figure 3:
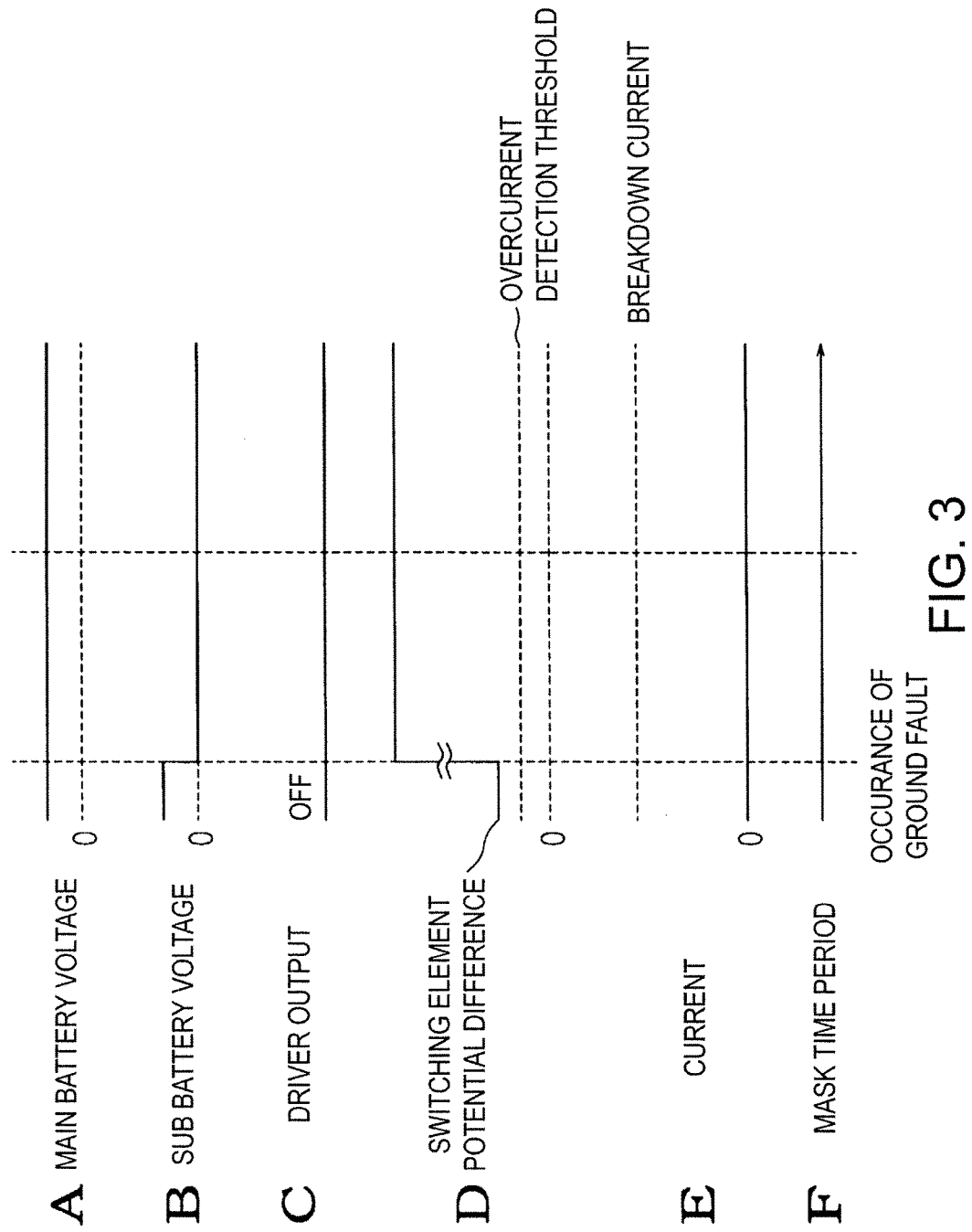
FIG. 3 is a timing diagram illustrating an example of an operation of the overcurrent protection circuit shown in FIG. 1.

Hereinafter, examples of operations of an overcurrent protection circuit having such a configuration will be described with reference to the timing diagrams of FIGS. 2 and 3.

The constant current circuit 3 generates a threshold voltage of a drop voltage by letting a constant current flow through the resistor 4. When an overcurrent flows through the switching element 7, and the value of a drop voltage caused by the on-resistance of the switching element 7 increases to a value that is larger than the value of the drop voltage generated by the constant current of the resistor 4 (the voltage value itself decreases), the comparator 2 needs only to output a plus signal so as to stop the driver 5a.

However, when the switching element 7 is off (FIGS. 2C and 3C), a differential voltage value between both ends of the switching element 7 (a switching element potential difference of FIGS. 2D and 3D) is a difference between an output voltage of the main battery 12 (FIGS. 2A and 3A) and an output voltage of the sub battery 13 (FIGS. 2B and 3B), and may exceed the threshold voltage. Therefore, a mask time period (FIGS. 2F and 3F) in which output of the comparator 2 is disabled needs to be provided for a time period in which the switching element 7 is off and a time period in which the state of the switching element 7 is transient from off to on.

In this overcurrent protection circuit, the mask time period is configured such that an inverted signal of a mask signal is given to the other input terminal of the AND circuit 1, and thus, during the mask time period, the AND circuit 1 continues to output an L-level signal and does not stop the driver 5a even when the output signal of the comparator 2 becomes positive.

Accordingly, in this overcurrent protection circuit, when the output of the driver 5a is off (FIGS. 2C and 3C), a mask signal is applied to realize the mask time period (FIGS. 2F and 3F), and thus the output signal of the comparator 2 is disabled although the differential voltage value between both ends of the switching element 7 (switching element potential difference of FIGS. 2D and 3D) exceeds the threshold voltage (overcurrent detection threshold).

Also in the transient time period (FIG. 2C) in which the output of the driver 5a changes from off to on, a mask signal is applied to realize the mask time period (FIG. 2F), and the output signal of the comparator 2 is disabled although the differential voltage value between both ends of the switching element 7 (switching element potential difference of FIG. 2D) exceeds the threshold voltage (overcurrent detection threshold).

A time period in which the output of the driver 5a steadily remains on (FIG. 2C) serves as a non-mask time period since no mask signal is applied (FIG. 2F).

In this state, if a ground fault occurs in the load 10 on the supply terminal side, the current flowing through the switching element 7 increases, and a differential voltage value between both ends of the switching element 7 exceeds the threshold voltage (overcurrent detection threshold). Accordingly, the comparator 2 outputs a plus signal, the AND circuit 1 outputs an H-level overcurrent detection signal, the output signal of the driver 5a changes from on to off, and the current flowing through the switching element 7 takes on zero without reaching a breakdown current.

If a ground fault occurs in the load 10 on the supply terminal (FIG. 3B) in the time period in which the switching element 7 is off, which serves as the mask time period (FIG. 3F), the differential voltage value between both ends of the switching element 7 (FIG. 3D) increases to the level of the output voltage of the main battery 12, and the output signal of the comparator 2 becomes positive but is disabled since it is in the mask time period (FIG. 3F).

On the other hand, the NAND circuit 14 has an H-level input from the main battery 12 side and an L-level input from the sub battery 13, and gives an H-level power-supply voltage abnormality signal to the driver 5a, preventing the operation of the driver 5a (FIG. 3C). As a result, the switching element 7 is protected since no current flows (FIG. 3E) therethrough. Thus, in the present preferred embodiment, even during the time period that the switching element 7 is off, or in a transition period from off to on, the switching element is protected from an over current situation even during the masking period. This is because the additional secondary protection circuit that prevents the switching element from being turned on if either of the respective voltages detected by the detection circuit is less than a predetermined value. That is, if a ground fault were to occur at either location that the detection circuit detects voltages, or if some abnormality were to occur that would cause one of the detection voltages to be lower than anticipated, the additional protection circuit would still protect the switching element, even during the masking period.

Figure 4:
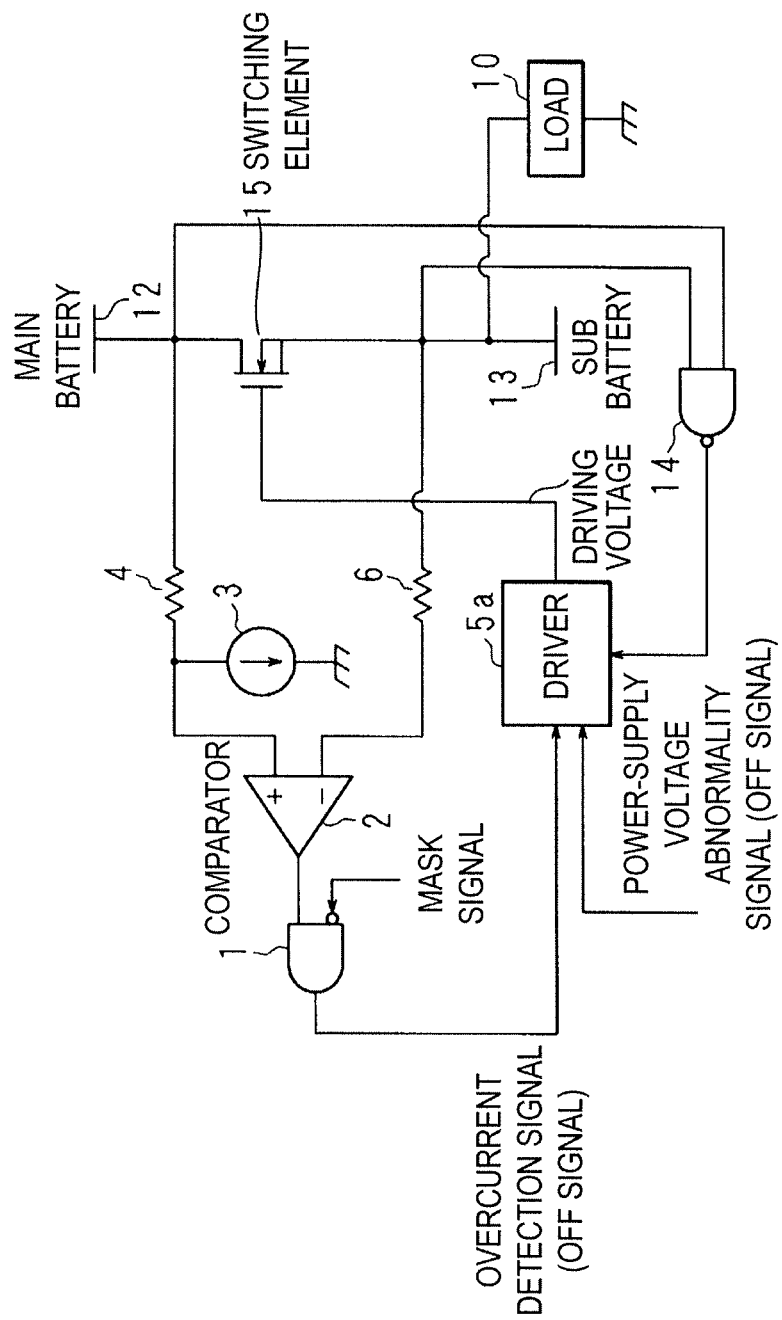
FIG. 4 is a circuit diagram illustrating another configuration of the main parts of the overcurrent protection circuit according to the embodiment.
Figure 5:
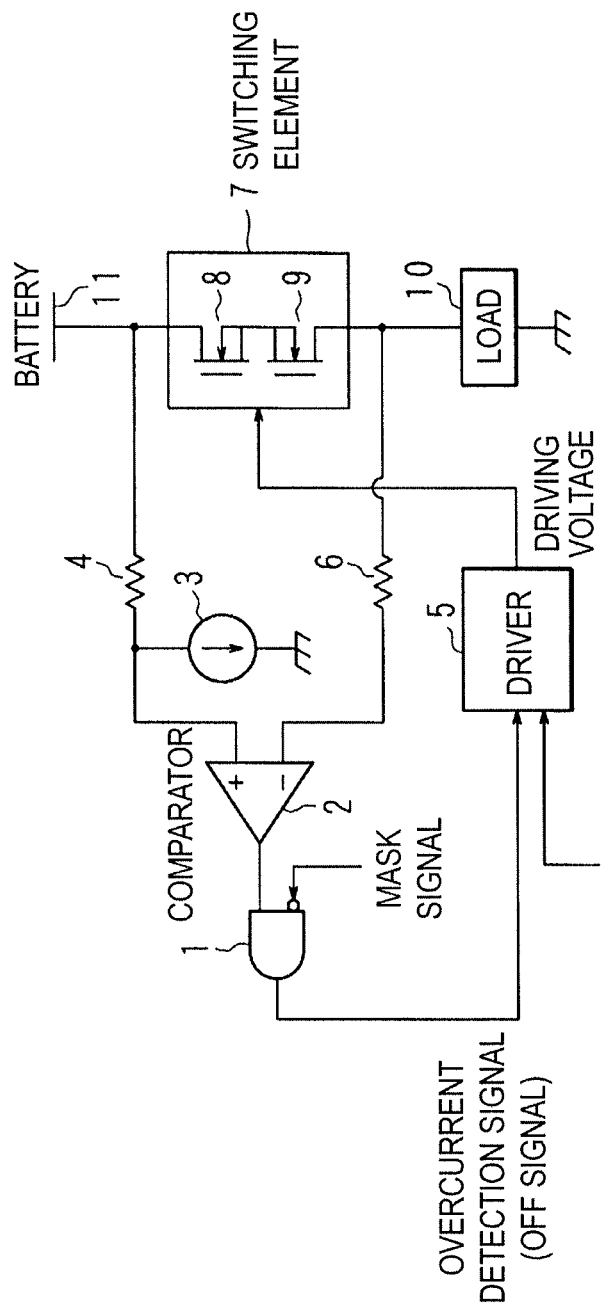
FIG. 5 is a circuit diagram illustrating an example of a configuration of the main parts of a conventional overcurrent protection circuit.
Figure 6:
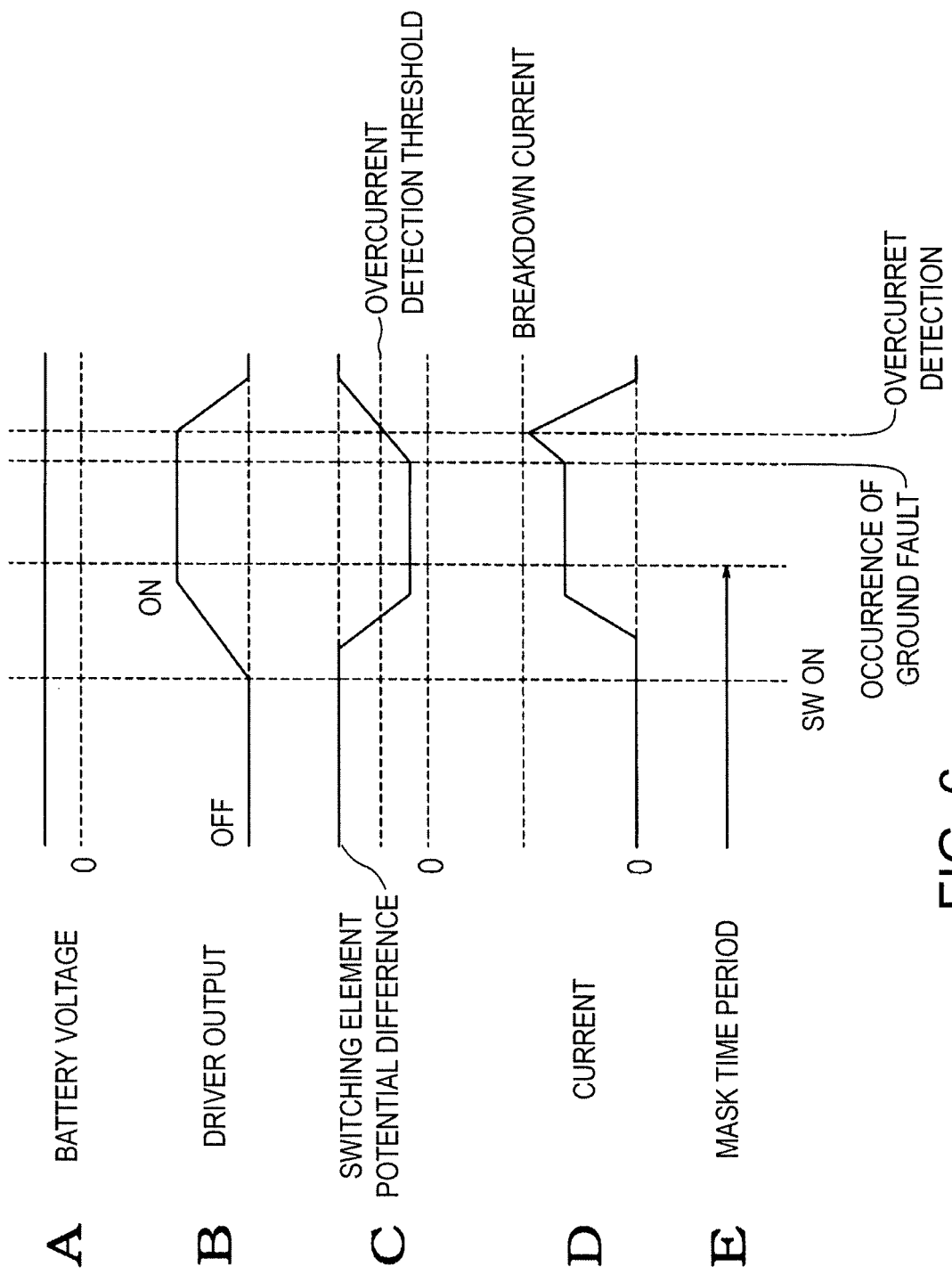
FIG. 6 is a timing diagram illustrating an example of an operation of the overcurrent protection circuit shown in FIG. 5.
Figure 7:
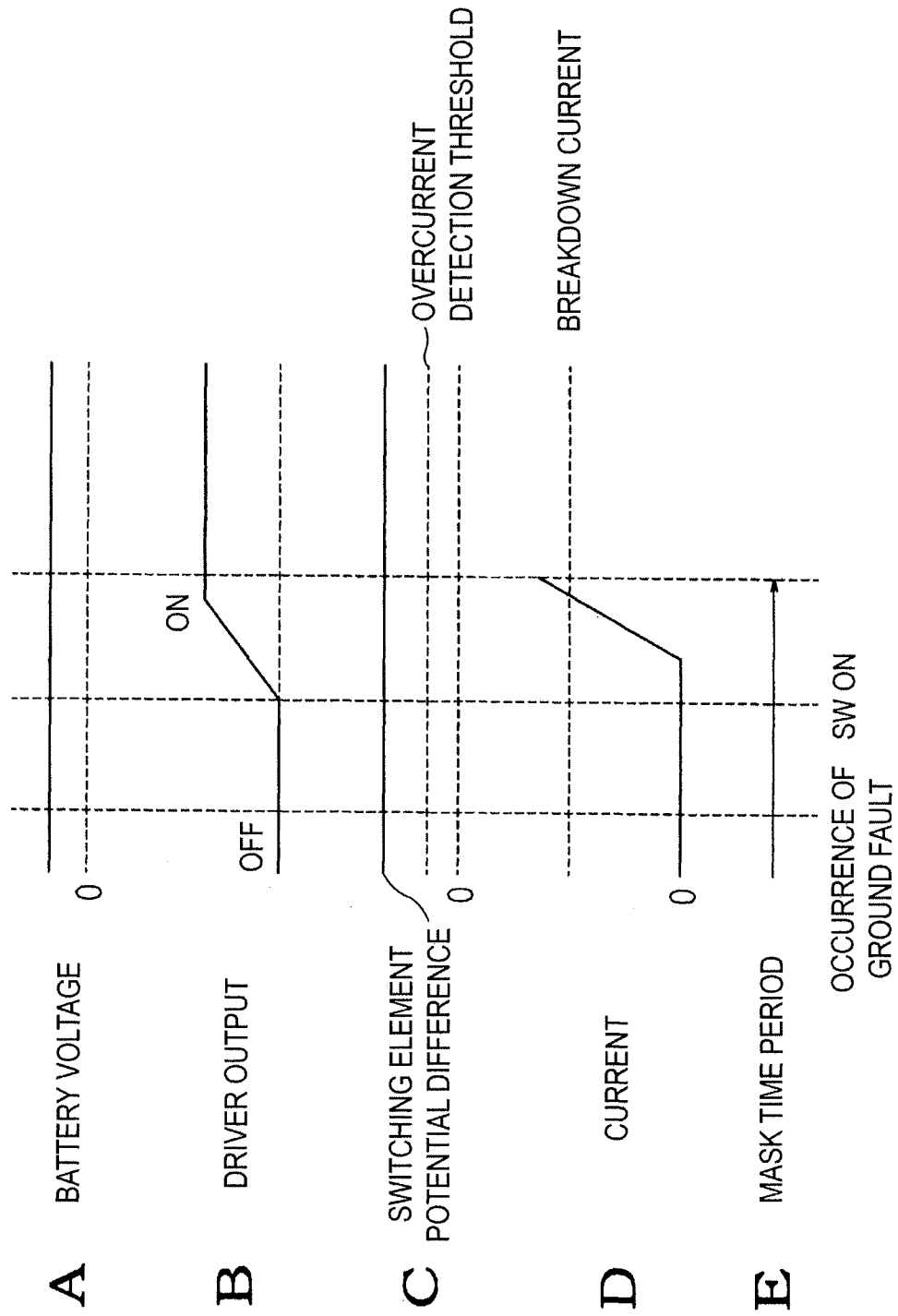
FIG. 7 is a timing diagram illustrating an example of an operation of the overcurrent protection circuit shown in FIG. 5.

Note that in the present embodiment, the switching element 7 has a configuration in which the sources of the FETs 8 and 9 are adjacent and connected to each other, but the switching element 7 may be replaced by an N-channel MOSFET 15, as shown in FIG. 4. The FET 15 is connected with its source to the plus electrode of the sub battery 13, and is connected with its drain to the plus electrode of the main battery 12.

INDUSTRIAL APPLICABILITY

Preferred embodiments are applicable to an overcurrent protection circuit that can turn off a switching element when an overcurrent flows through the switching element, protecting the switching element.

LIST OF REFERENCE NUMERALS

1 AND circuit
2 Comparator
3 Constant current circuit
4, 6 Resistor
5a Driver
7 Switching element
8, 9, 15 FET
10 Load 12 Main battery (main storage cell)
13 Sub battery (auxiliary storage device, auxiliary energy storage device)
14 NAND circuit (preventing means)

The invention claimed is:

1. An overcurrent protection circuit configured to detect a differential voltage value between both ends of a switching element that is caused by an electric current flowing through the switching element when the switching element is on, and turn off the switching element when the detected differential voltage value is larger than a predetermined voltage value, the overcurrent protection circuit comprising:
   a secondary detection circuit configured to detect respective voltage values at the both ends of the switching element; and
   a driver configured to prevent the switching element from being turned on if either of the respective voltage values detected by the secondary detection circuit is less than the predetermined voltage value.

2. The overcurrent protection circuit according to claim 1, wherein the secondary detection circuit is a NAND circuit or an AND circuit to which the respective voltage values at the both ends are input.

3. The overcurrent protection circuit according to claim 1, wherein the switching element is connected between a main storage cell and an auxiliary storage device that is auxiliary to the main storage cell, and the voltage values at the both ends are respective output voltage values of the main storage cell and the auxiliary storage device.

4. The overcurrent protection circuit according to claim 2, wherein the switching element is connected between a main storage cell and an auxiliary storage device that is auxiliary to the main storage cell, and the voltage values at the both ends are respective output voltage values of the main storage cell and the auxiliary storage device.

5. An overcurrent protection circuit for a switching element, the overcurrent protection circuit comprising:
   a switching element driver configured to control an ON and OFF state of the switching element;
   a first detection circuit configured to detect respective voltage values at both ends of the switching element, the first detection circuit being configured to: (i) output a first warning signal to the switching element driver if a differential voltage value between both ends of the switching element exceeds a predetermined voltage value when the switching element is ON, and (ii) not output the first warning signal to the switching element driver if a differential voltage value between both ends of the switching element exceeds a predetermined voltage value when the switching element is OFF;
   a secondary detection circuit configured to detect respective voltage values at both ends of the switching element, the second detection circuit configured to output a secondary warning signal to the switching element driver if either of the respective voltage values is less than the predetermined voltage value;
   wherein the switching element driver is configured to cause the switching element to be in the OFF state if either the first warning signal or secondary warning signal are received by the switching element driver.

6. The overcurrent protection circuit according to claim 5, wherein the switching element is connected between a main storage cell and an auxiliary energy storage device, and the voltage values at the both ends are respective output voltage values of the main storage cell and the auxiliary energy storage device.

* * * * *